United States Patent
Hsiao

(10) Patent No.: US 7,026,852 B2
(45) Date of Patent: Apr. 11, 2006

(54) APPARATUS AND METHOD FOR GENERATING WOBBLE CLOCK

(75) Inventor: Yuan-Kun Hsiao, Taipei Hsien (TW)

(73) Assignee: VIA Optical Solution, Inc., Taipei Hsien (TW)

( * ) Notice: Subject to any disclaimer, the term of this patent is extended or adjusted under 35 U.S.C. 154(b) by 0 days.

(21) Appl. No.: 10/709,003

(22) Filed: Apr. 7, 2004

(65) Prior Publication Data
US 2005/0007720 A1 Jan. 13, 2005

Related U.S. Application Data

(60) Provisional application No. 60/461,578, filed on Apr. 10, 2003.

(51) Int. Cl.
*G06F 1/04* (2006.01)

(52) U.S. Cl. ........................ 327/291; 327/147

(58) Field of Classification Search .................. None
See application file for complete search history.

(56) References Cited

U.S. PATENT DOCUMENTS

| | | | | |
|---|---|---|---|---|
| 6,333,902 B1 * | 12/2001 | Shim | ....................... | 369/47.54 |
| 6,345,023 B1 * | 2/2002 | Fushimi et al. | .......... | 369/47.36 |
| 6,661,752 B1 * | 12/2003 | Eom | ......................... | 369/47.1 |
| 6,891,785 B1 * | 5/2005 | Yamamoto et al. | ...... | 369/47.28 |

FOREIGN PATENT DOCUMENTS

| | | |
|---|---|---|
| CN | 1373474 A | 10/2002 |
| JP | 11-353686 | 12/1999 |

* cited by examiner

*Primary Examiner*—Kenneth B. Wells
*Assistant Examiner*—Cassandra Cox
(74) *Attorney, Agent, or Firm*—Winston Hsu

(57) ABSTRACT

An apparatus for generating wobble clock comprises: a comparing circuit and a phase lock loop. The comparing circuit generates a combining signal according to peak values of the wobble signal and compares the output signal with a reference voltage to output a control signal. The phase lock loop drives the wobble clock to be synchronized with the wobble signal if the protection signal corresponds to a first logic level, and stops driving the wobble clock to be synchronized with the wobble signal if the protect signal corresponds to a second logic level.

18 Claims, 10 Drawing Sheets

APPARATUS AND METHOD FOR GENERATING WOBBLE CLOCK

BACKGROUND OF INVENTION

1. Field of the Invention

The invention relates to a wobble clock signal generating circuit of an optical disc drive, and more particularly, to a wobble clock signal generating circuit having both a controlling mechanism and the capability of generating a non-phase-modulated wobble clock signal according to a phase-modulated wobble signal.

2. Description of the Prior Art

In present day information society, storage of large amounts of information has become a major problem. Of all types of storage medium, the optical disc is one of the most useful mediums because of its high storage capacity and small physical volume. However, as multimedia technology progresses increased storage requirements are required, and the storing capacity of a normal CD optical disc (650 MB) is becoming increasingly less satisfactory. Therefore, a new optical disc standard, the digital versatile disc (DVD), with increased storage capacity, has emerged. The physical size of a DVD is almost identical to that of a CD; however, the storage capacity of a DVD is much larger than that of a CD. The DVD, also known as a multi-function digital disc, was first utilized for storing video data because of its large storing capacity (about 4.7 GB in a storing layer). A video approximately two hours in length can be stored on the storing layer. However, as the DVD becomes more popular, the multi-function digital disc is gradually being used for other storage tasks. For instance, large amounts of backed up data off a computer's hard drive can be often stored on a single multi-function digital disc, compared to the multiple number of CDs required to do the same task.

FIG. 1 is a diagram of a pickup head of an optical disc drive 31 in the process of reading data from an optical disc. The optical pickup head 31 comprises a receiver (not shown in FIG. 1) for reading data signals 30 on the data tracks, and four sensors Sa, Sb, Sc, Sd for reading the information of a wobble track 28 (or simply wobble). The wobble track is used predominantly for addressing the data signal on the DVD. In FIG. 1, the positions of Sa and Sd correspond to the troughs (or grooves) of the wobble track 28 on the reflection layer of the optical disc, and the positions of Sc and Sb correspond to the peaks (or bulges) of the wobble track 28 of the reflection layer of the optical disc. Because of the differences between reflection characteristics of the grooves and bulges, sensors Sa, Sb, Sc, Sd detect different amount of reflected light. The reflection amount detected by sensor Sa is subtracted by the reflection amount detected by sensor Sd, and the subtracted value is converted into an electric signal such that a wobble signal is generated. With the rotation of the optical disc, the optical pickup head 31 travels along the reflection layer in the direction of arrow 32 and receives reflection values from each sensor along the track. The sensors Sa–Sd installed on the top of the optical pickup head 31 detect different reflection values as they cross the curves of wobble track 28. For example, when the optical pickup head 31 reaches position P1, sensors Sa, Sd move from the groove to the bulge of the wobble track. Therefore, the optical pickup head 31 can generate a wobble signal due to the wobble track, and ADIP (Address In Pre-groove) can be read by decoding the wobble signal.

As known by those skilled in the art, ADIP are stored in the wobble track through phase modulation. Every two storage-areas of the optical disc 10 correspond to 93 wobbles, where 8 wobbles are used to store ADIP through phase modulation. Therefore, the optical disc drive has to utilize an ADIP decoder to get the ADIP from the wobble signal.

FIG. 2 is a diagram of a prior art analog ADIP decoder 40. The ADIP decoder 40 comprises a delay circuit 42, a mixer 44, a phase lock loop (PLL) 46, a frequency divider 48, and a XOR logic arithmetic circuit 50. The following trigonometric function is used as the foundation of the ADIP decoder:

$$\mathrm{Sin}(\theta) * \mathrm{Cos}(\theta) = \frac{1}{2}\mathrm{Sin}(2\theta). \tag{1}$$

If the wobble signal is represented as $\mathrm{Sin}(\theta)$, then $0.5*\mathrm{Sin}(2\theta)$ can be obtained from equation 1. As mentioned above, the ADIP are stored in the wobble signal through phase modulation, therefore, when the wobble signal, and the corresponding ADIP, have a 180-degrees phase shift, the wobble signal is represented as $\mathrm{Sin}(\theta+180°)$. According to the above equation 1, $0.5*\mathrm{Sin}(2\theta+360°)$ can be calculated from $\mathrm{Sin}(\theta+180°)$. Furthermore, $0.5*\mathrm{Sin}(2\theta+360°)$ is equal to $0.5*\mathrm{Sin}(2\theta)$, therefore, a non-phase-modulated wobble clock can be generated according to the phase-modulated wobble signal. The analog ADIP decoder 40 generates the non-phase-modulated wobble clock according to the above-mentioned concepts, and executes decoding operation for reading ADIP according to the wobble clock.

As shown in FIG. 2, signal S1 is a wobble signal, and the delay circuit 42 is used to delay signal S1 for generating signal S2. The delay circuit 42 delays signal S one quarter of a period. This means that the phase difference between signal S2 and signal S1 is 90° such that if signal S1 is represented by $\mathrm{Sin}(\theta)$, signal S2 is represented by $\mathrm{Sin}(\theta+90°)$ or $\mathrm{Cos}(\theta)$. The mixer 44 is used to multiply signals S1 and S2 together to generate signal S3. According to equation 1, signal S3 is $0.5*\mathrm{Sin}(2\theta)$, thus the frequency of signal S3 is double of that of signal S1. Then using signal S3, the PLL 46 generates signal S4 that is synchronous to signal S3. This means that the PLL 46 outputs a signal S4 equal to $\mathrm{Sin}(2\theta)$. Finally, the frequency divider 48 divides signal S4, and generates signal S5 that has half of the frequency of signal S4. Note that signal S5 is a non-phase-modulated wobble clock signal (wobble clock hereafter), and signal S1 is a phase-modulated wobble signal. Therefore, after the XOR logic arithmetic circuit 50 executes an XOR logic arithmetic on signal S5 and signal S1, the ADIP can be obtained from the period of phase change of signal S1 obtained by the above-mentioned operations.

Because the analog circuit cannot accurately differentiate signal S1 to generate signal S2, the delay circuit 42 is used to change signal from $\mathrm{Sin}(\theta)$ to $\mathrm{Cos}(\theta)$. This means that the delay circuit 42 has to delay signal S1 one quarter of a period. But if rotating speed of the optical disc varies, the frequency of signal S1 also changes. So the delay circuit 42 needs to be self-adjusting in order to provide an accurate delay based on the varying signal S1. This in particular, makes the delay circuit 42 complicated and difficult to design and produce.

FIG. 3 is a diagram of a prior art digital ADIP decoder 60. The digital ADIP decoder 60 comprises an analog-to-digital converter (ADC) 62, a differentiator 64, a multiplier 66, PLL 68, a frequency divider 70, and an XOR logic arithmetic circuit 72. The digital ADIP decoder 60 also generates a non-phase-modulated wobble clock for executing decoding operation on the wobble signal according to the above-mentioned equation 1. Signal S1 is an analog wobble signal, therefore the ADC 62 transforms the analog signal S1 into a corresponding digital signal S2 for further digital signal processing. The differentiator 64 differentiates signal S2 to generate a corresponding signal S3. If the analog signal S1 is $Sin(\theta)$, then the digital signal S2 can still be regarded as $Sin(\theta)$. After the differentiation operation, signal S3 is equal to $Cos(\theta)$. The multiplier 66 is used to execute multiplying operation on Signals S2 and S3 to output signal S4. According to equation 1, signal S4 is equal to $0.5*Sin(2\theta)$. This means that the frequency of signal S4 is double of the frequency of signal S2.

Then signal S4 is fed into the PLL 68 generating a clock signal S5, which is fed back into the PLL 68 in order to ensure it is synchronous to signal S4. This means that the PLL 68 can output signal S5 corresponding to $Sin(2\theta)$. Next, the frequency divider 70 divides signal S5, creating signal S6 that has half the frequency of signal S5. Finally, the XOR logic arithmetic circuit 72 executes an XOR logic arithmetic operation on signals S6 and S2. Thus, the period of phase variation of signal S2 is decoded, and the ADIP is obtained. Because the digital ADIP decoder 60 uses a differentiator 64 (versus a delay circuit) to generate the $Cos(\theta)$ signal, the self-adjusting delay problem of the analog decoder 40 is circumvented.

When the digital ADIP decoder 60 operates, the analog wobble signal is first digitalized and then differentiated. Success of this device is dependent upon the high execution efficiency of the ADC 62 and the differentiator 64. Furthermore, to prevent distortion while transforming the analog signal S1 into the digital signal S2, the ADC 62 must use many bits to quantify the analog signal. These two points in particular, drive the cost of the digital ADIP decoder 60 up, such that the markets of high-speed DVD+R and DVD+RW optical disc drives, do not bear the cost thought the advantage is high.]

SUMMARY OF INVENTION

It is therefore one of the objectives of the claimed invention to provide a wobble clock generating circuit for generating a non-phase-modulated wobble clock according to a phase-modulated wobble signal to solve the above-mentioned problems.

According to an exemplary embodiment of the claimed invention, it discloses a clock signal generating circuit for receiving a phase-modulated input signal to generate a non-phase-modulated target clock signal, the clock signal generating circuit comprising: a comparing circuit for generating a combining signal according to peak values of the input signal and comparing the combining signal with a reference voltage to generate a first protection signal; and a phase lock loop (PLL) electrically connected to the comparing circuit for receiving the input signal and the first protection signal to generate the target clock signal that is a feedback to an input end of the phase lock loop, for driving the target clock signal synchronous to the input signal according to a first logic level of the input signal, and for not driving the target clock signal synchronous to the input signal according to a second logic level of the input signal to keep outputting the target clock signal.

Additionally, the present invention discloses a clock signal generating method for generating a non-phase-modulated target clock signal according to a phase-modulated input signal, the clock signal generating method comprising: determining whether adjusting the phase of the input signal to be synchronous with the phase of the target clock signal according to a first protection signal for outputting a control signal; outputting a control voltage according to the control signal; adjusting the frequency of the target clock signal according to the control voltage; and generating the first protection signal according to voltage differences between a combining signal generated from peak values of the input signal and a reference voltage.

Regardless of the variance of the phase-modulated wobble signal, the present invention wobble clock generating circuit is capable of dynamically generating a needed non-phase-modulated wobble signal according to the phase-modulated. Furthermore, the present invention wobble clock generating circuit is easy to be embodied. Therefore, the present invention wobble clock generating circuit costs only a few, and can be utilized in either DVD+R optical disc drive or DVD+RW optical disc drive.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
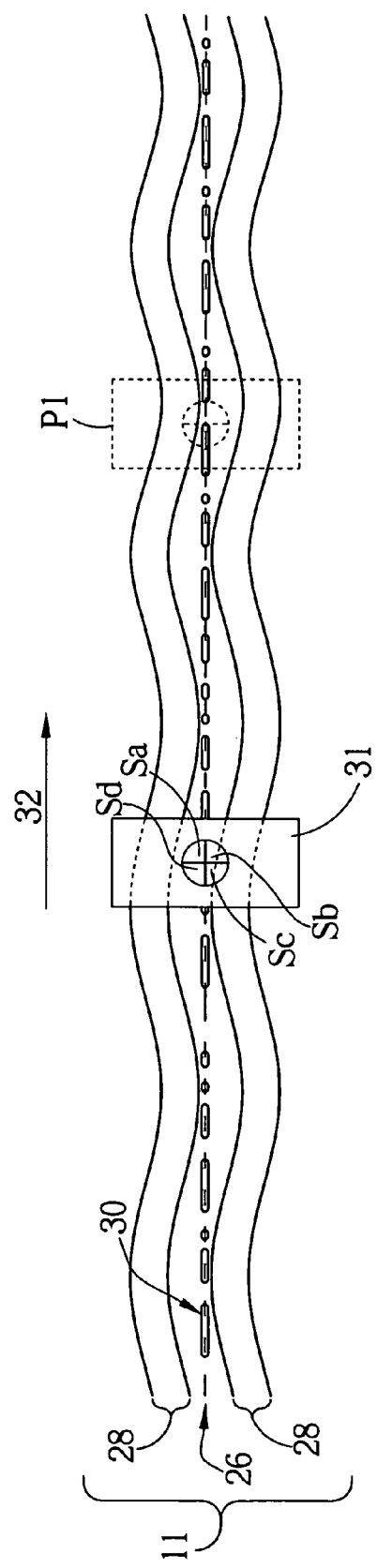
FIG. 1 is a diagram of a pickup head of a prior art optical disc drive reading data from an optical disc.
Figure 2:
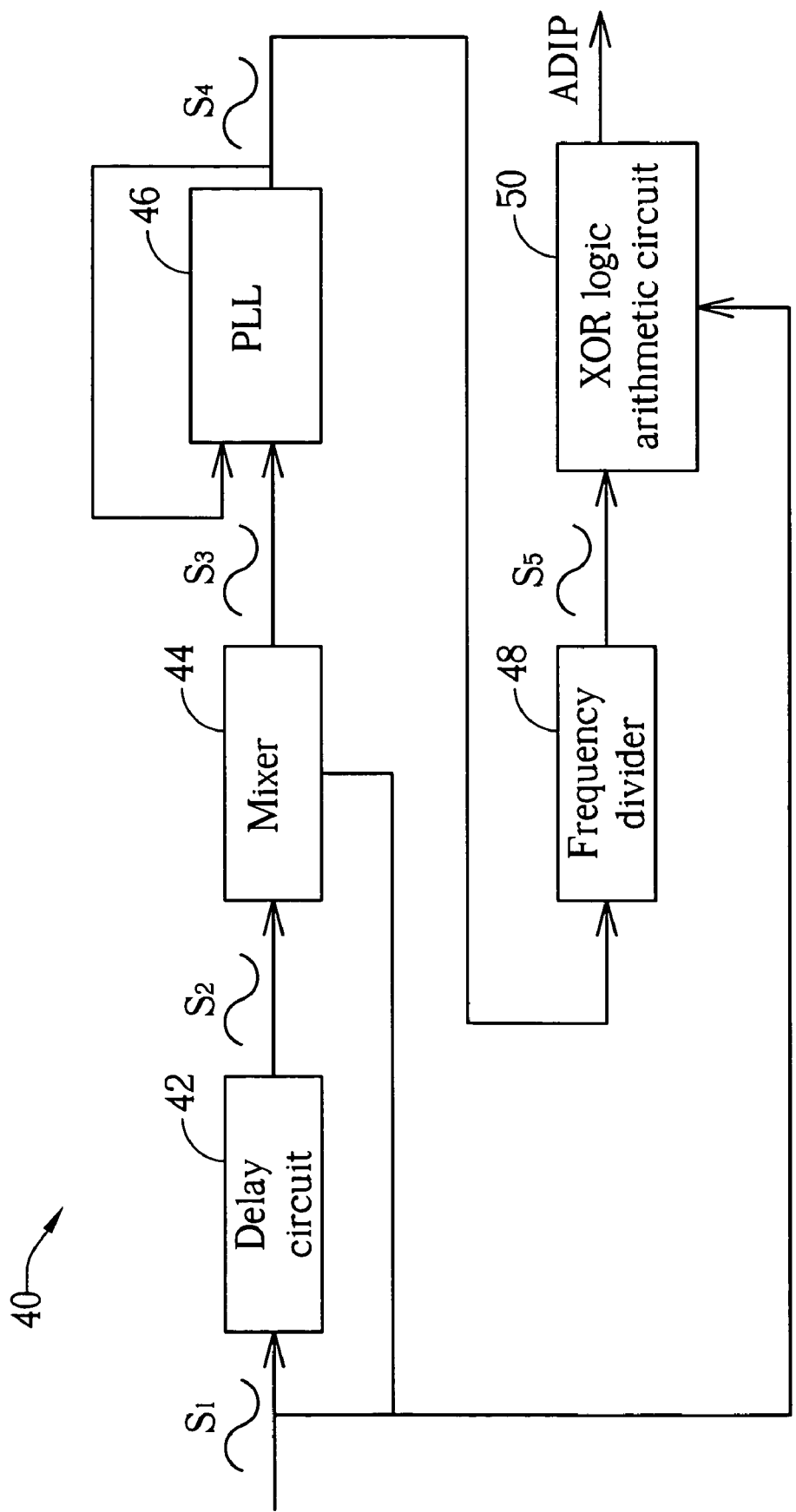
FIG. 2 is a block diagram of an analog ADIP decoder according to the prior art.
Figure 3:
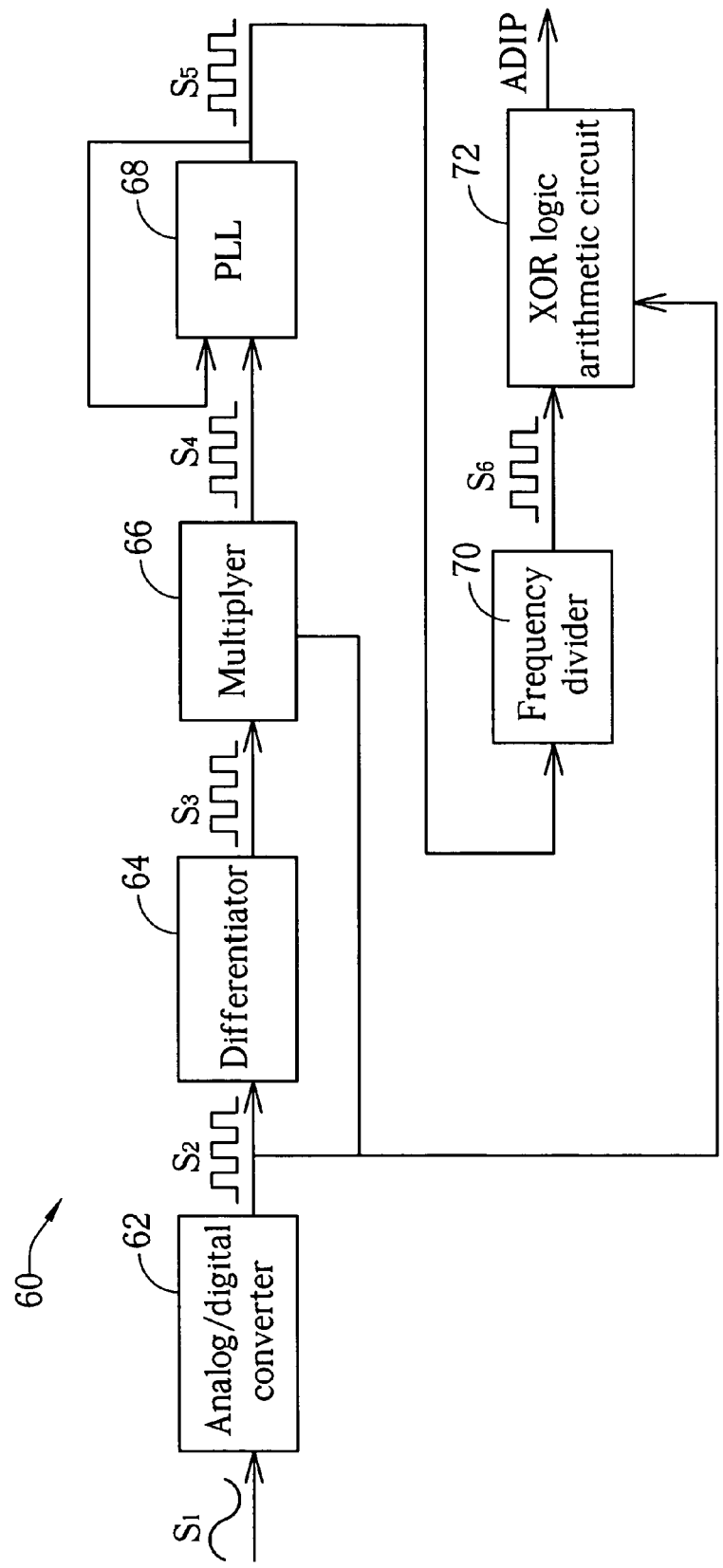
FIG. 3 is a block diagram of a digital ADIP decoder according to the prior art.
Figure 4:
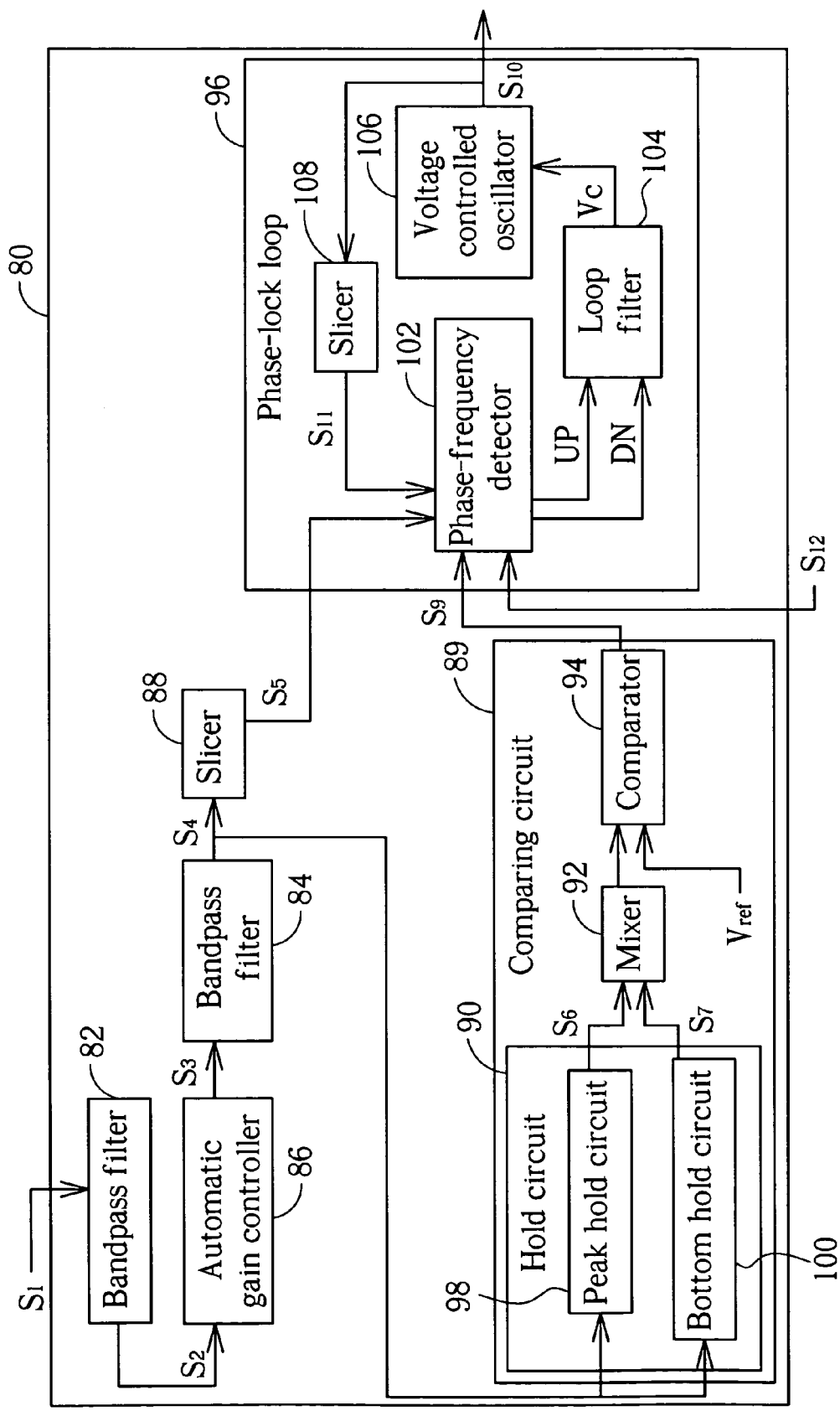
FIG. 4 is a block diagram of a wobble clock generating circuit according to the present invention.

Please refer to FIG. 4, which is a block diagram of a wobble clock generating circuit 80 according to the present invention. The wobble clock generating circuit 80 comprises band-pass filters (BPF) 82 and 84, an automatic gain controller (AGC) 86, a slicer 88, a comparing circuit 89, and a PLL 96. Furthermore, the comparing circuit 89 comprises a hold circuit 90, a mixer 92, and a comparator 94. The hold circuit 90 comprises a peak hold circuit 98 and a bottom hold circuit 100. The PLL 96 comprises a phase-frequency detector (PFD) 102, a loop filter 104, a voltage-controlled oscillator (VCO) 106, and a slicer 108. The BPF 82 and 84 both have high Q factors and are used to filter out signals with frequencies that are in a predetermined frequency range. The BPF 82 is used to deal with wobble signal S1 read from a DVD+R optical disc or a DVD+RW optical disc and output a signal S2 to AGC 86. Note that the wobble signal S1 contains a wobble period of phase modulation for storing ADIP. As known by those skilled in the art, the AGC 86 utilizes different gain values to adjust amplitude of input signal. This means that when the amplitude of signal S2 is small, the AGC 86 raises its gain value to maintain corresponding amplitude of signal S3; conversely, if the amplitude of signal S2 is large, the AGC 86 reduces its gain value to maintain the corresponding amplitude of signal S3. Then signal S3 is processed by the BPF 84 to generate signal S4, which is outputted to the slicer 88. The slicer 88 utilizes a predetermined voltage level to transform signal S4 (Sin wave) into signal S5 (square wave). This means that when signal S4 is larger than the predetermined voltage level, the slicer 88 sets signal S5 to a logic value of 1. Oppositely, when signal S4 is lower than the predetermined voltage level, the slicer sets signal S5 to logic value of 0. Therefore, in this embodiment, it is necessary that the AGC 86 output a stable signal S3 to prevent the slicer 88 from misunderstanding logic values when executing signal processing.

Figure 5:
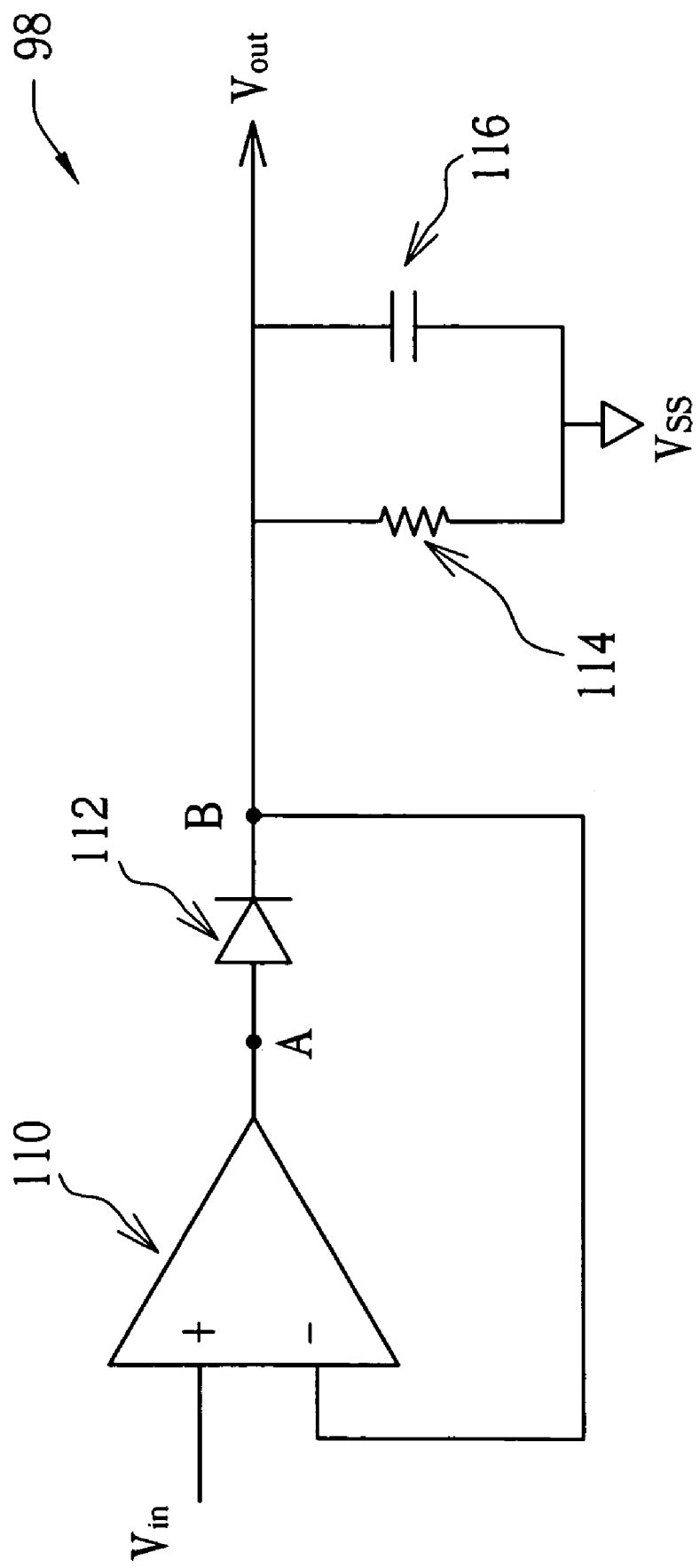
FIG. 5 is a circuit diagram of a peak hold circuit of the wobble clock generating circuit of FIG. 4.
Figure 6:
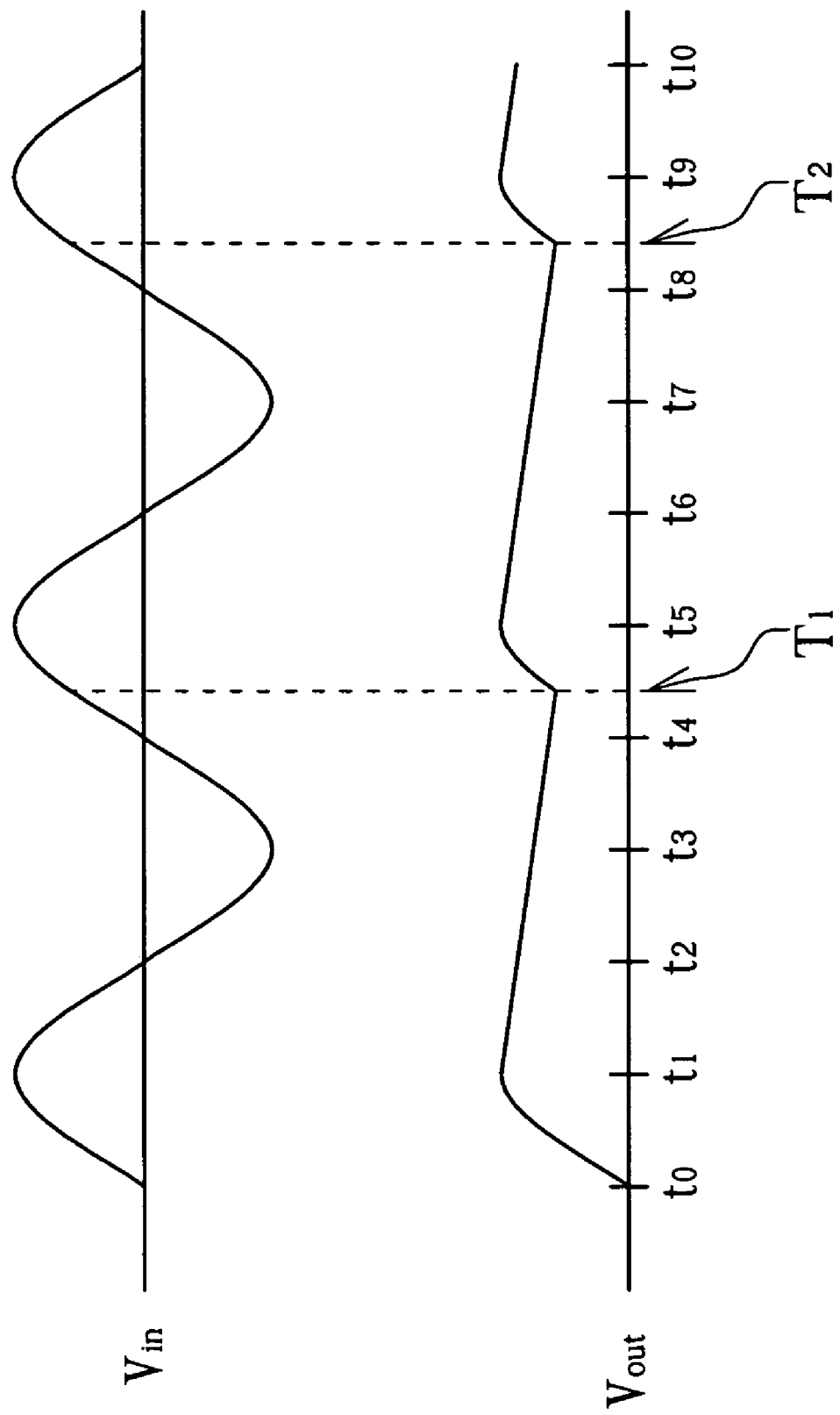
FIG. 6 is an operational diagram of the peak hold circuit of FIG. 5.

In addition, signal S4 outputted by BPF 84 is inputted to the hold circuit 90. The hold circuit is mainly used for generating signals S6 and S7 according to peak values of signal S4. In the hold circuit 90, the peak hold circuit 98 is used for maintaining peak values of signal S4 as output signal S6, and the bottom hold circuit 100 is used for maintaining bottom values of signal S4 as output signal S6. Operations of the peak hold circuit 98 and the bottom hold circuit 100 is simply illustrated as follows. Please refer to FIG. 5 and FIG. 6, which are the circuit diagram of a peak hold circuit 98 of FIG. 4, and the operational diagram of the peak hold circuit 98 of FIG. 5, respectively. The peak hold circuit 98 comprises an operational amplifier 110, a diode 112, a resistor 114, and a capacitor 116. Assuming that the gain value of the operational amplifier 110 is 1, and the voltage Vss is a ground voltage, at time t0 the input voltage Vin starts to rise. Because the voltage level of node A is larger than the voltage level of node B, the diode 112 is forward-biased and operates such that the input voltage Vin charges capacitor 116 and the output voltage Vout increases with the input voltage Vin. At time t1, the input voltage Vin reaches its positive peak. After time t1, the level of the input voltage Vin begins to reduce. Note that the capacitor 116 maintains the output voltage Vout to correspond to the positive peak of the input voltage Vin at time t1. Simultaneously, the capacitor 116 discharges through resistor 114, thus reducing the voltage level of output voltage Vout. This reduction occurs until the output voltage Vout and the input voltage Vin are equal to each other at time T1. After time T1, the input voltage Vin continuously increases for some time. This means that after time T1, the voltage level of node A is larger than the voltage level of node B again, such that the diode 112 begins conduction. Therefore, the input voltage Vin charges the capacitor 116 again until the positive peak at time t5. Similarly, after time t5 the capacitor 116 discharges until the output voltage Vout is equal to the input voltage Vin at time T2. Then the process of charging capacitor 116 occurs in the same way. By adjusting the resistance value of the resistor 114, the discharging efficiency of the capacitor 116 can be adjusted so that the output voltage Vout is always closer to the positive peak of the input voltage Vin.

Figure 7:
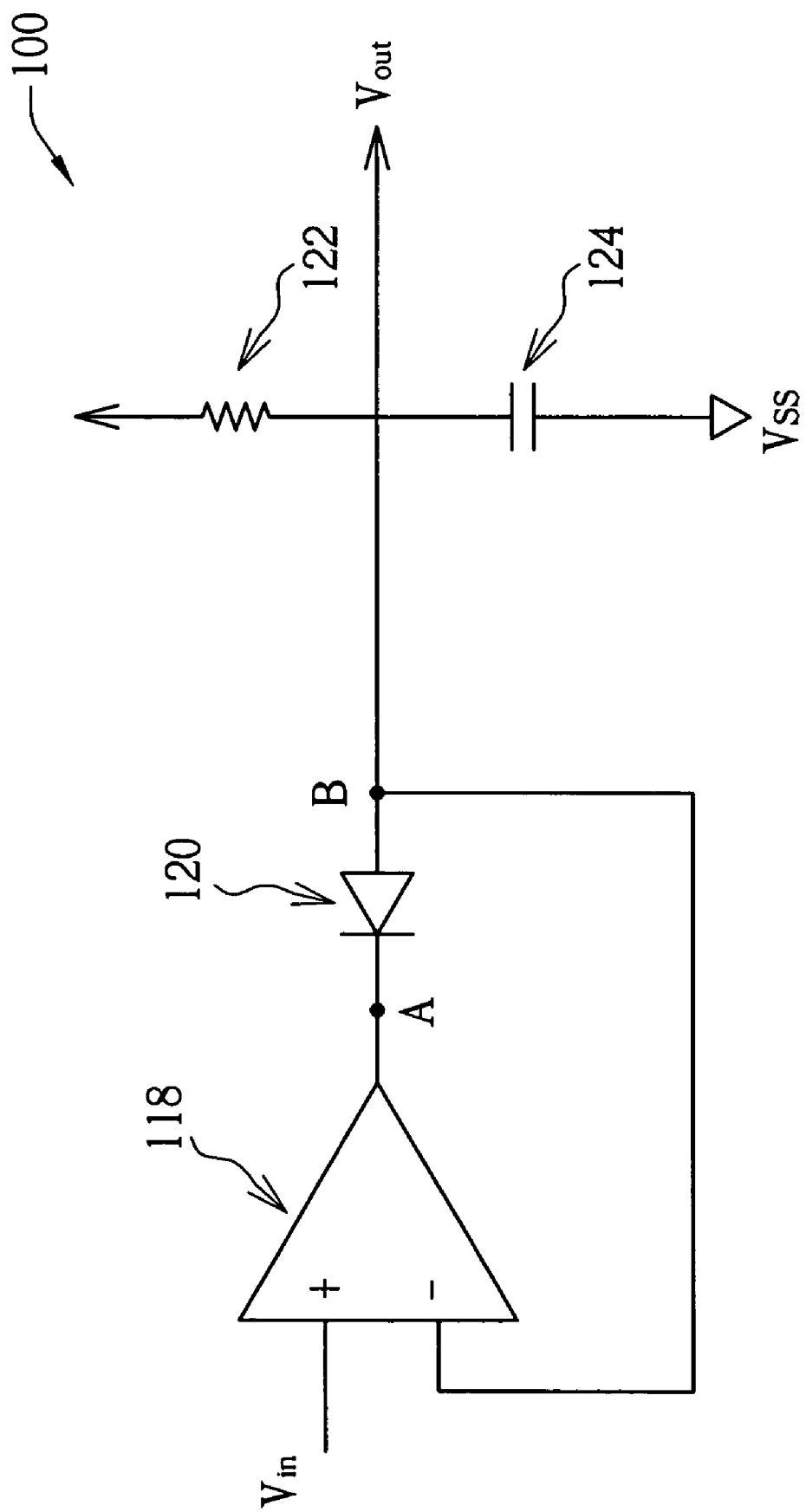
FIG. 7 is a circuit diagram of a bottom hold circuit of the wobble clock generating circuit of FIG. 4.
Figure 8:
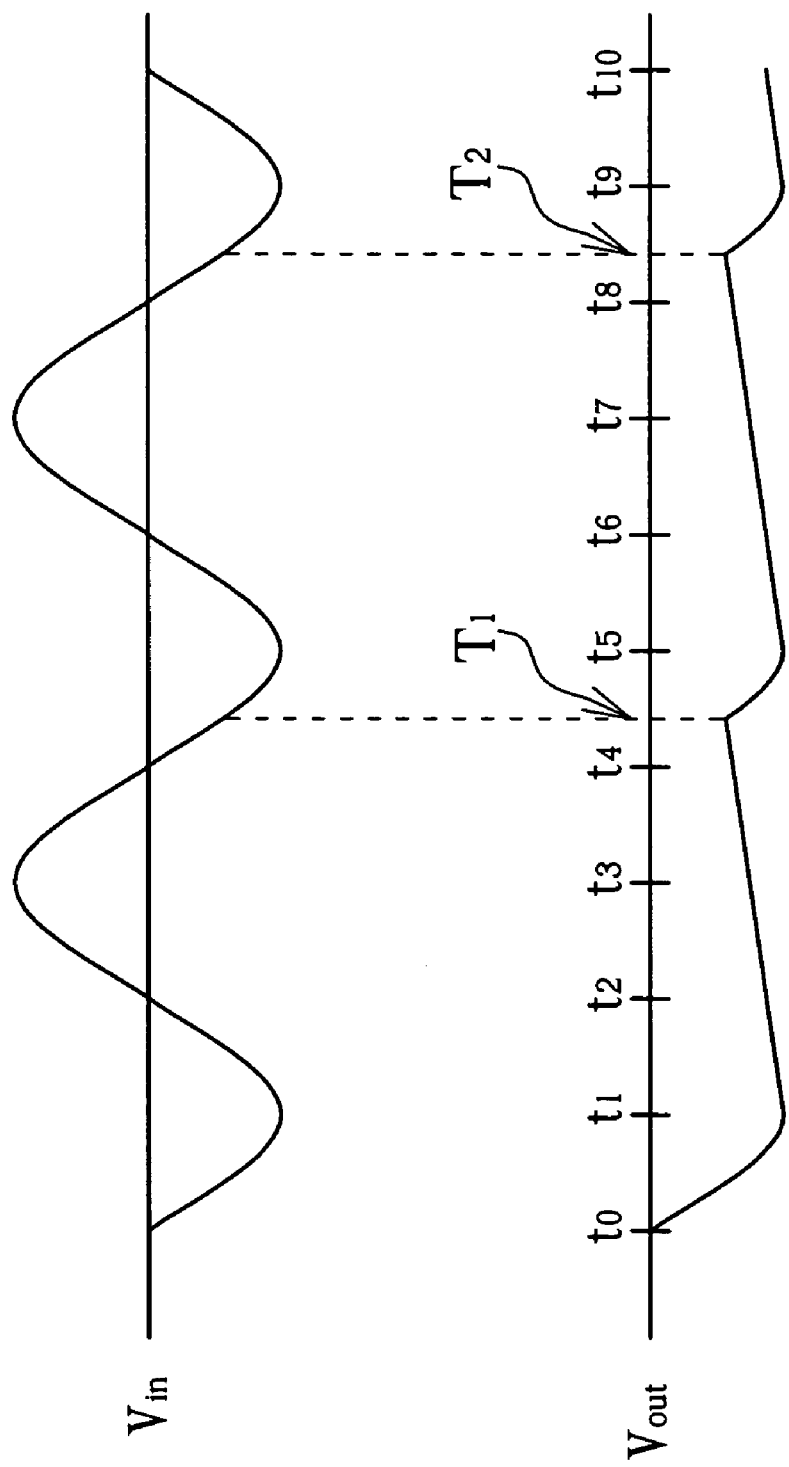
FIG. 8 is an operational diagram of the bottom hold circuit of FIG. 7.

Please refer to FIG. 7 and FIG. 8. FIG. 7 is a circuit diagram of the bottom hold circuit 100 of FIG. 4. FIG. 8 is an operation diagram of the bottom hold circuit of FIG. 7. The bottom hold circuit 100 comprises an operational amplifier 118, a diode 120, a resistor 122, and a capacitor 124. Assuming that the gain value of the operational amplifier 118 is 1, the voltage Vss is a ground voltage, and the voltage Vdd is a high voltage. Therefore, voltage Vdd first charges the capacitor 124 to a predetermined voltage level larger then voltage Vss through resistor 122. And at time t0, the input voltage Vin starts to decrease. At this time, because the voltage level of node A is lower than the voltage level of node B, the diode 112 is forward biased and conducts such that the input voltage Vin drives the output voltage Vout to decrease as the input voltage Vin. At time t1, the input voltage Vin reaches the negative peak. This also means that the input voltage Vin begins to increase its voltage level after time t1. Note that the capacitor 124 maintains the output voltage Vout to the corresponding negative peak value of the input voltage Vin. Therefore, when the input voltage Vin starts to increases its voltage level after time t1, the voltage level of node A is larger than the voltage level of node B, and the diode 112 is reverse biased and regarded as a disconnection. Simultaneously, the voltage Vdd charges the capacitor 124 to raise the voltage level of output voltage Vout through the resistor 122. The input voltage Vin and the output voltage Vout are equal to each other at time T1, and the input voltage Vin continuously decreases after time T1. This means that the voltage level of node A is lower than the voltage level of node B such that the diode 112 conducts after time T1. Therefore, the input voltage Vin starts to drive the output voltage Vout until the output voltage Vout reaches the negative peak at time t5. Similarly, after time t5 the voltage Vdd starts to charge the capacitor 24 until the output voltage Vout is again equal to the input voltage Vin at time T2. Then the input voltage Vin again drives the output voltage Vout down. Similarly to what was mentioned above, by adjusting the resistance value of the resistor 122, the charging efficiency of the capacitor 124 can be adjusted such that the output voltage Vout is always close to the negative peak of the input voltage Vin.

As shown in FIG. 4, signals S6 and S7 are further utilized by the mixer 92 for generating a signal S8 according to the voltage difference between signals S6 and S7. At last, the comparator 94 compares a reference voltage Vref and the voltage level of signal S8. This is done to determine the area where signal S4 corresponds to the phase-modulated period of signal S1. The comparator 94 outputs this information as a signal S9 to the PLL 96.

In the PLL 96, the signal S10 (Sin wave) outputted by the voltage controlled oscillator 106 is transformed into a corresponding signal S11 (square wave) through slicer 108. Then signal S11 is inputted into the PFD 102 as a feedback. The PFD 102 compares the phase relationship between signals S11 and S5 to generates a control signal UP and a control signal DN to the loop filter 104. The loop filter outputs a stable direct control voltage Vc to the VCO 106 according to the control signal UP and the control signal DN. Generally speaking, the loop filter 104 comprises a charge pump for outputting a direct control voltage Vc according to the control signals UP and DN. The voltage level of the direct control voltage Vc is used to adjust the frequency of the input signal S10.

For example, if the rising edge of signal S11 is formed before the rising edge of signal S5, the PFD 102 is triggered to generate the control signal DN to lower the direct control voltage Vc such that the frequency of signal S10 is reduced. As well, the next rising edge of signal S11 is delayed to adjust for the situation of the phase of signal S11 prior to the phase of signal S5. When the rising edge of signal S5 is later formed, the PFD 102 is triggered to generate an impulse of the control signal UP and resets the control signals UP, DN, thus completing this phase-adjusting step. Oppositely, if the rising edge of signal S5 is formed before the rising edge of signal S1, the PFD 102 is triggered to generate the control signal UP that raises the direct control voltage Vc, such that the frequency of signal S10 is raised. As well, the next rising edge of signal S11 is expedited to adjust for the phase lag of signal S11. When the rising edge of signal S11 is later formed, the PFD 102 is triggered to generate an impulse of the control signal DN, which simultaneously resets the control signals UP, DN, thus completing this phase-adjusting step. Considering one further example, when signal S11 and signal S5 have the same phase, the rising edges of signals S11 and S5 triggers PFD 102 to generate an impulse of control signals UP, DN at the same time. When this occurs, the PFD 102 resets the control signals UP, DN at the same time. Because control signals UP and DN are used to raise and reduce the voltage level of the direct control voltage Vc, respectively, and because the triggering of the control signals occurs at the same time, no adjustment to the direct control voltage Vc is made. Therefore, when signals S11 and S5 have the same phase, the PLL 96 does not adjust the direct control voltage Vc and it continues to maintain signal S10.

Because in this embodiment, the period of phase modulation of signal S1 makes the period of signal S5 correspond to an unstable frequency, the hold circuit 90 is used to detect the period of phase modulation of signal S1 and outputs the signal S9 to stop PFD 102 from outputting control signals UP and DN. Therefore, a situation where the PLL 96 wrongly drives signal S10 to lock signal S5 to an unstable frequency, is avoidable. Note that when the PFD 102 does not output control signals UP, DN, the loop filter 104 maintains the currently used direct control voltage Vc, hence the VCO 106 continues to output the signal S10 unadjusted.

Figure 9:
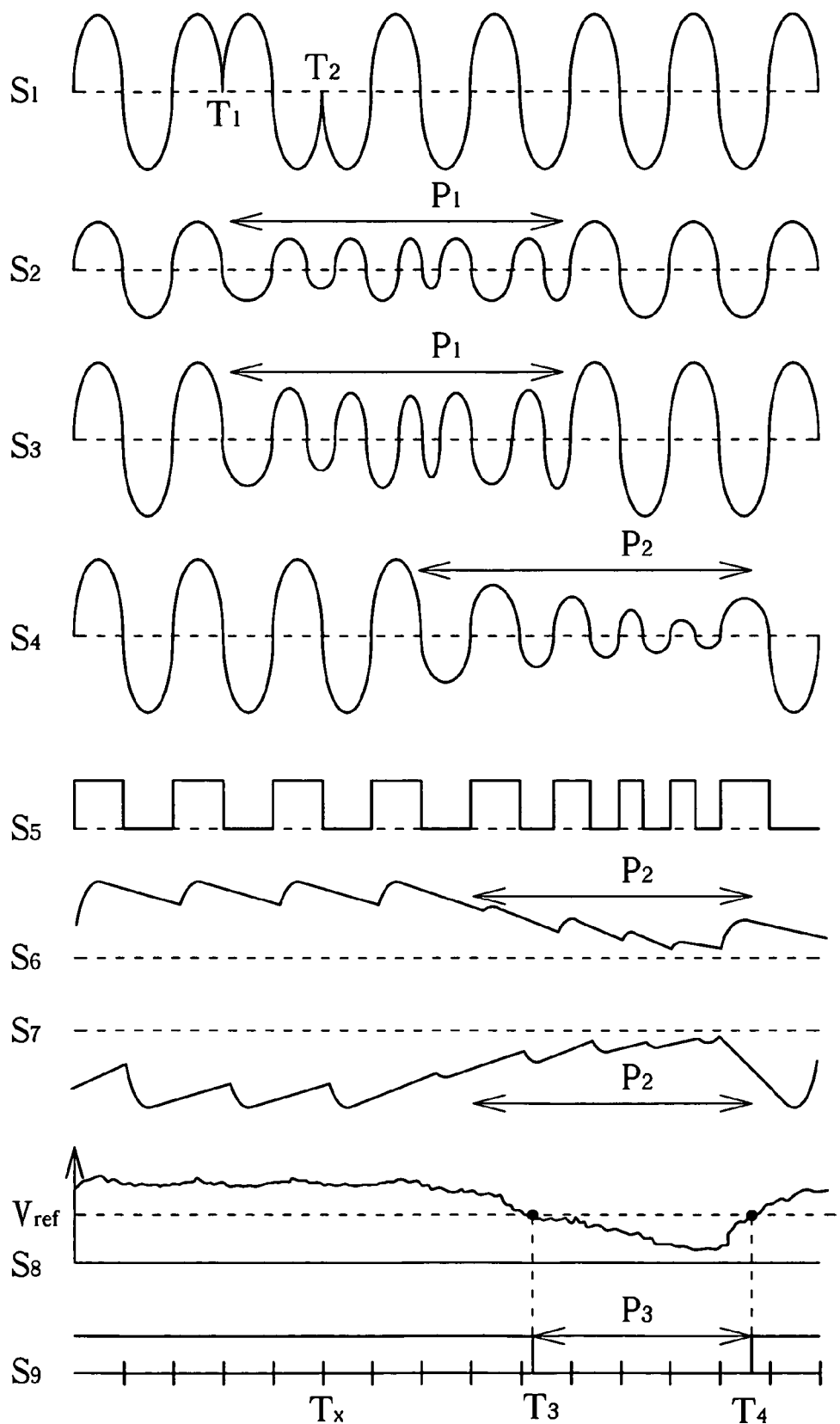
FIG. 9 is an operational diagram of the wobble clock generating circuit of FIG. 4.

The operation of the present invention, wobble clock generating circuit 80, is illustrated as follows. Please refer to FIG. 4 and FIG. 9. FIG. 9 is an operation diagram of the wobble clock generating circuit 80 in FIG. 4. From the top to the bottom of FIG. 9, the wave charts represent signals S1, S2, S3, S4, S5, S6, S7, S8, and S9, respectively. Note that signal S1 has a 180° phase change between time T1 and time T2. This means that signal S1 comprises a period of phase modulation. Because the BPF 82 has a high Q factor, part of signal S1 which does not correspond to a predetermined frequency is substantially decayed and other parts of signal S1, which correspond to the period of phase modulation, are transformed by the BPF 82 into a frequency-conversed signal with delayed phase. The frequency of signal S2 unstably changes. Furthermore, when pickup head of optical disc drive reads wobble signal (signal S1), the amplitude of signal S1 may change because of vibration. In addition, the BPF 82 may decay the amplitude of signal S2 when processing signal S1. Therefore, in this embodiment, the AGC 86 is utilized to automatically adjust the gain value corresponding to signal S2 to maintain a stable signal S3 so that the hold circuit 90 can output correct signals S6 and S7. Because the AGC 86 only adjusts the amplitude of signal S3, the frequency of signal S3 does not change. Signal S3 corresponds to an unstable frequency during time interval P1. As mentioned above, the BPF 84 has high Q factor, therefore the BPF 84 decays signals that do not correspond to a predetermined frequency. This means that if the frequency of signal S3 in the time interval P1 diverges from the predetermined frequency, the amplitude of signal S3 in the time interval P1 is decayed. As shown in FIG. 9, signal S4 in the time interval P2 corresponds to lower amplitude. Then the slicer 88 transforms signal S4 (Sin wave) into signal S5 (square wave) and outputs signal S5 to the PLL 96.

As mentioned above, in this embodiment, signal S9 is generated for controlling whether the PFD 102 outputs control signals UP, DN used for adjusting direct control voltage Vc. The operation is illustrated as follows. As shown in FIG. 4, signal S4 is not only inputted into the slicer 88, but also inputted into the hold circuit 90. Operations of the peak hold circuit 98 and the bottom hold circuit 100 are illustrated as above (refer to FIG. 6 and FIG. 8). Therefore, when signal S4 is inputted into the peak hold circuit 98, the peak hold circuit 98 drives signal S6 to change with the positive peaks of signal S4. Similarly, when signal S4 is inputted into the bottom hold circuit 100, the bottom hold circuit 100 drives signal S7 to change as the negative peaks of signal S4. The output result of signals S6 and S7 are shown in FIG. 9. Because signal S4 corresponds to lower amplitude in time interval P2, signal S6 is influenced to correspond to lower positive peaks. Similarly, signal S7 is influenced, too. And then, the mixer 92 calculates the difference between signal S6 and signal S7. As shown in FIG. 9, signal S8 corresponds to lower voltage level in a time interval. For transforming signal S8 into a control signal, the comparator 94 is used for comparing signal S8 and a reference voltage Vref, where the signal of signal S8 larger than the reference voltage Vref corresponds to logic value 1, and the other corresponds to logic value 0. The comparing result is shown in FIG. 9, signal S9 in time interval P3 corresponds to logic level 0 for representing that signal S4 corresponds to an unstable frequency (due to signal S1 of phase modulation) in time interval P3, therefore, in time T3, the PFD 102 stops outputting control signals UP, DN. This means that the PLL 96 dose not adjust signal S10 until time T4, and the PFD 102 starts to continue to output control signals UP, DN for adjusting signal S10.

The operation and function of the PLL 96 are known by those skilled in the art, and thus omitted here. In addition, in this embodiment, the PLL 96 has to decide whether it starts to drive signal S11 to have the same phase as that of signal S5 according to signal S9. So, any prior art PLL which is capable of deciding whether it starts to drive signal S11 to have the same phase as that of signal S5 can be used in the present invention wobble clock generating circuit 80. In other words, the present invention wobble clock generating circuit 80 can utilize any prior art PLL to embody the PLL 96. Furthermore, the peak hold circuit 98 and the bottom hold circuit 100 in FIG. 5 and FIG. 7 can respectively be used for generating signal S6 and signal S7 according to signal S4. However, any prior art hold circuit can be used in the present invention wobble clock generating circuit 80 for tracing peaks of signal S4. In addition, in this embodiment, signals S6, S7 outputted by the peak hold circuit 98 and the bottom hold circuit 100 are compared to act as a protection mechanism from unstable frequency. Utilizing the difference between signals S6, S7 can start the protection mechanism, such that the present invention wobble clock generating circuit 80 performs more accurately and efficiently. However, only utilizing either signal S6 outputted by the peak hold circuit 98 or signal S7 outputted by the bottom hold circuit to compare with the reference voltage Vref for determining the timing of the protection mechanism is also possible. This obeys the spirit of the present invention.

As shown in FIG. 4, signal S4 is inputted to the PFD 102 after processed by the slicer 88. However, signal S4 needs to be inputted to the PFD 102 after processed by the hold circuit 90, the mixer 92, and the comparator 94. This means that the timing of signal S4 inputted to the PFD 102 in the time interval P2 may be earlier than the timing of signal S9 driving the PFD 102. In other words, before signal S9 starts the protection of signal S10 to prevent from impact of phase-modulated wobble signal at time T3, signal S4 has been inputted to PFD 102 to influence signal S10 generated by the PLL 96 in time interval P2. For solving the above-mentioned problem, the present invention wobble clock generating circuit 80 further utilizes a pre-protecting mechanism, and the related operation is illustrated as follows. According to the standards of DVD+R and DVD+RW, two storing areas correspond to 93 wobbles. In other words, an ADIP unit is composed of 93 wobbles, wherein 8 wobbles are used for storing needed ADIP through phase modulation, other 85 wobbles are used for storing information other than phase modulation. Therefore, in this embodiment, 85 non-phase modulated wobbles of the phase-modulated wobble signal (signal S1) are utilized to generate a non-phase-modulated wobble clock (signal S10), and the non-phase-modulated wobble clock is utilized to be executed an XOR logic arithmetic with the phase-modulated wobble signal for decoding ADIP. Therefore, signal S10 generated by the present invention wobble clock generating circuit 80 can be used to decode the ADIP, in which 8 wobbles correspond to in an ADIP unit. According to the standards of DVD+R and DVD+RW, the following 85 wobbles have the same phase as that of signal S10. So, if signal S10 can be successfully used for decoding the information in an ADIP unit, then the signal S10 generated by the present invention wobble clock generating circuit 80 is the needed wobble clock. Because it is known that 8 phase-modulated wobbles follows 85 wobbles according to standards of DVD+R and DVD+RW, PFD 102 is stopped from outputting control signals UP, DN a predetermined time interval before the timing of next ADIP unit.

Figure 10:
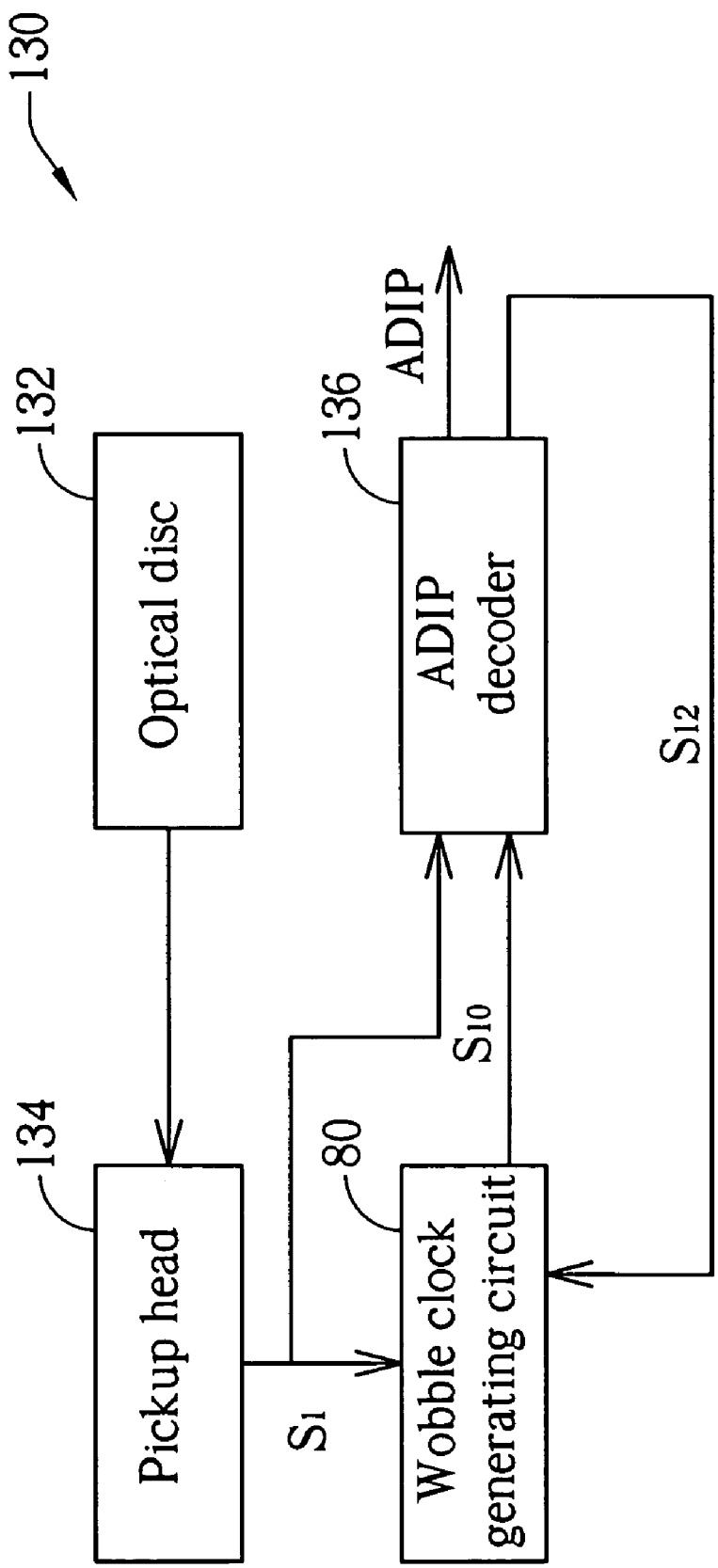
FIG. 10 is a block diagram of an optical disc accessing system utilizing the wobble clock generating circuit of FIG. 4.

Please refer to FIG. 10, which is a diagram of the wobble clock generating circuit 80 utilizing in an optical disc accessing system 130. The optical disc accessing system 130 comprises an optical disc 132, a pickup head 134, a wobble clock generating circuit 80, and an ADIP decoder 136. The pickup head 134 is capable of reading wobbles on the optical disc 132 and generating the phase-modulated wobble signal (signal S1). As above, the wobble clock generating circuit 80 is capable of generating the non-phase-modulated wobble clock (signal S10) according to phase-modulated signal S1. The ADIP decoder 136 can utilize signal S10 to decode the ADIP stored in signal S1. For example, performing an XOR logic arithmetic on signal S10 and signal S1 can decode the ADIP stored through phase modulation. This means that it can read synchronous units or data units in each 93 wobbles from signal S1. Furthermore, because each 93 wobbles (corresponding to an ADIP unit), uses 8 wobbles for the period of phase modulation and 85 wobbles for the non-phase-modulated, the ADIP decoder 136 can predict the timing of the first wobble of next ADIP unit when decoding signal S1. Please note that the first wobble has 180° phase change, so it is easily seen in FIG. 4 that signal S9 is generated according to signal S4. If the timing is such that the first wobble of ADIP unit is inputted to the PFD 102 is earlier than the timing of signal S9, which starts to protection the PLL 96, then the PLL 96 may operates incorrectly and affect the originally correct signal S10. Therefore, in this embodiment, after the ADIP decoder 136 successfully utilizes signal S10 generated by the PLL 96 to decode a plurality of ADIP units, the ADIP decoder 136 predicts the first wobble of next ADIP unit, and outputs signal S12 to PFD 102 a predetermined time interval before the next ADIP unit. This also means that signal S12 can replace the function of signal S9 to protect the PLL 96. As shown in FIG. 9, signal S12 can drive the PFD 102 to stop outputting control signals UP, DN at time Tx.

Please note that, in this embodiment, signal S10 makes it possible to enable signal S12 to protect the PLL 96 after the ADIP decoder 136 successfully decodes a plurality of ADIP units. But if signal S10 is not stable yet, the ADIP decoder 136 may wrongly predicts the timing of the first wobble of the next ADIP unit. Therefore, it is possible that the timing of signal S12 protecting the PLL 96 is later than the timing of signal S9 protecting the PLL 96. In other words, this makes the function of signal S12 useless. Similarly, it is possible that the timing of signal S12 protecting the PLL 96 is so early that the protection time duration of the PLL is too long. Because the present invention wobble clock generating circuit 80 utilizes non-phase-modulated 85 wobbles to generate signal S10, if the protection time duration of PLL 96 is too long, then the PLL 96 can not lock needed signal S10. This means that the execution efficiency of the PLL 96 is worse. Therefore, the present invention wobble clock generating circuit 80 firstly utilizes signal S9 to protect the PLL 96 to generate a stable and correct signal S10, and then utilizes signal S12 outputted by ADIP decoder 136 to replace signal S9 for early protection. Similarly, if the wobble clock generating circuit 80 has utilized signal S12 to protect PLL 96, then the signal S10 outputted by the wobble clock generating circuit 80 can not be utilized by the ADIP decoder 136 to accurately predict the timing of the phase-modulated wobble. This represents that the frequency or the phase of signal S1 change so that signal S10 is affected. Therefore, the ADIP decoder 136 stops outputting signal S12 to wobble clock generating circuit 80. This means that the wobble clock generating circuit 80 stops utilizing the protection mechanism of signal S12 and back utilizes the protection mechanism of signal S9 until the PLL 96 is stably locked again and the signal S10 is correct. And then the protection mechanism of signal S12 can restart to protect the PLL 96.

In contrast to the prior art, the present invention can utilize the original phase-modulated wobble signal comprising phase-modulated wobbles and non-phase-modulated wobbles to generate a non-phase wobble clock. Therefore, when the present invention wobble clock generating circuit utilizes the PLL to lock the needed wobble clock, such that it has the same phase as that of the non-phase modulated wobbles of the wobble signal, the present invention wobble clock generating circuit further utilizes a hold circuit to generate a protecting signal so that the PLL is paused when the wobble signal corresponding to the period of phase modulation is inputted to the PLL. Furthermore, when the wobble clock can be utilized to decode the ADIP of the phase-modulated wobble signal, the present invention wobble clock generating circuit can dynamically generate the needed wobble clock according to the phase-modulated wobble signal. On the other hand, the present invention wobble clock generating circuit is easy to be embodied. Therefore, the present invention wobble clock generating circuit has low costs, and can be utilized in either DVD+R or DVD+RW optical disc drives.

Those skilled in the art will readily observe that numerous modifications and alterations of the device may be made while hold the teachings of the invention. Accordingly, the above disclosure should be construed as limited only by the metes and bounds of the appended claims.

What is claimed is:

1. A clock signal generating circuit for receiving a phase-modulated input signal to generate a non-phase-modulated target clock signal, the clock signal generating circuit comprising:

a comparing circuit for generating a combining signal according to peak values of the input signal and comparing the combining signal with a reference voltage to generate a first protection signal; and a phase lock loop (PLL) electrically connected to the comparing circuit for receiving the input signal and the first protection signal to generate the target clock signal that is a feedback to an input end of the phase lock loop, for driving the target clock signal synchronous to the input signal according to a first logic level of the first protection signal, and for not driving the target clock signal synchronous to the input signal according to a second logic level of the first protection signal to keep outputting the target clock signal.

2. The clock signal generating circuit of claim 1 wherein the comparing circuit comprises:
   a hold circuit for receiving the input signal to obtain a peak signal and a bottom signal of the input signal;
   a combining circuit electrically connected to the hold circuit for generating the combining signal according to voltage differences between the peak signal and the bottom signal; and
   a comparator electrically connected to the combining circuit for comparing the combining signal with the reference voltage and outputting the first protection signal according to a comparing result.

3. The clock signal generating circuit of claim 2 wherein the hold circuit comprises:
   a peak hold circuit for generating the peak signal according to the reference signal; and
   a bottom hold circuit for generating the bottom signal according to the reference signal.

4. The clock signal generating circuit of claim 1 further comprising:
   a first band-pass filter for controlling the input signal to correspond to a predetermined frequency range before the input signal is inputted into the PLL and the comparing circuit; and
   a first slicer having an output end electrically connected to the PLL for slicing the input signal into a square waveform.

5. The clock signal generating circuit of claim 4 further comprising:
   an automatic gain controller electrically connected to the first band-pass filter for adjusting the amplitude of the input signal by utilizing different gain values; and
   a second band-pass filter having an input end electrically connected to the automatic gain controller and having an output end electrically connected to the first slicer, the second band-pass filter being used for controlling the amplified input signal to correspond to the predetermined frequency range.

6. The clock signal generating circuit of claim 1 wherein if the voltage difference between the combining signal and the predetermined reference voltage is not larger than a threshold value, the first protection signal corresponds to the first logic level.

7. The clock signal generating circuit of claim 1 wherein the first protection signal corresponds to the first logic level when the voltage difference between the combining signal and the predetermined reference voltage is not larger than a threshold value for a predetermined period of time.

8. The clock signal generating circuit of claim 1 wherein the first protection signal corresponds to the second logic level when the voltage difference between the combining signal and the predetermined reference voltage is larger than a threshold value.

9. The clock signal generating circuit of claim 1 wherein the first protection signal corresponds to the second logic level when the voltage difference between the combining signal and the predetermined reference voltage is larger than a threshold value for a predetermined period of time.

10. The clock signal generating circuit of claim 1 wherein the optical disc drive comprises an address in pre-groove decoder for predicting a timing that the input signal forms the phase modulation, and for generating a second protection signal before a predetermined time interval to the timing to control the target clock signal not to be synchronous with the input signal to maintain the target clock signal.

11. A clock signal generating method for generating a non-phase-modulated target clock signal according to a phase-modulated input signal, the clock signal generating method comprising:
    determining whether to adjust the phase of the input signal to be synchronous with the phase of the target clock signal according to a first protection signal for outputting a control signal;
    outputting a control voltage according to the control signal;
    adjusting the frequency of the target clock signal according to the control voltage; and
    generating the first protection signal according to voltage differences between a combining signal generated from peak values of the input signal and a reference voltage.

12. The clock signal generating method of claim 11 wherein the step of generating the first protection signal comprises:
    getting a bottom signal and a peak signal of the input signal;
    generating the combining signal according to voltage differences between the peak signal and the bottom signal; and
    comparing voltage differences between the combining signal and the predetermined reference voltage to output the first protection signal.

13. The clock signal generating method of claim 11 wherein the input signal is compared with the target clock signal to drive the target clock signal synchronous with the input signal when the first protection signal corresponds to a first logic level, and the target clock signal is maintained without being driven to be synchronous with the input signal when the first protection signal corresponds to a second logic level.

14. The clock signal generating method of claim 13 wherein if the voltage difference between the combining signal and the predetermined reference voltage is not larger than a threshold value, the first protection signal corresponds to the first logic level.

15. The clock signal generating method of claim 13 wherein the first protection signal corresponds to the first logic level when the voltage difference between the combining signal and the predetermined reference voltage is not larger than a threshold value for a predetermined period of time.

16. The clock signal generating method of claim 13 wherein the first protection signal corresponds to the second logic level when the voltage difference between the combining signal and the predetermined reference voltage is larger than a threshold value.

17. The clock signal generating method of claim 13 wherein the first protection signal corresponds to the second logic level when the voltage difference between the combining signal and the predetermined reference voltage is larger than a threshold value for a predetermined period of time.

18. The clock signal generating method of claim 17 further comprising:
    predicting the timing when the input signal forms the phase modulation, and
    generating a second protection signal before a predetermined time interval to the timing to control the target clock signal not to adjust the input signal for maintaining the target clock signal.

* * * * *